US012234540B2

(12) United States Patent
Niu et al.

(10) Patent No.: US 12,234,540 B2
(45) Date of Patent: Feb. 25, 2025

(54) MASK, MASK DEVICE AND MASK DESIGN METHOD

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Tong Niu, Beijing (CN); Fengli Ji, Beijing (CN); Jianpeng Wu, Beijing (CN); Sen Du, Beijing (CN)

(73) Assignees: Chengdu BOE Optoelectronics Technology Co., Ltd., Sichuan (CN); BOE Technology Group Co., Ltd., Beijing (CN)

(*) Notice: Subject to any disclaimer, the term of this patent is extended or adjusted under 35 U.S.C. 154(b) by 852 days.

(21) Appl. No.: 17/255,580

(22) PCT Filed: May 27, 2020

(86) PCT No.: PCT/CN2020/092531
§ 371 (c)(1),
(2) Date: Dec. 23, 2020

(87) PCT Pub. No.: WO2021/036372
PCT Pub. Date: Mar. 4, 2021

(65) Prior Publication Data
US 2021/0371966 A1 Dec. 2, 2021

(30) Foreign Application Priority Data
Aug. 28, 2019 (CN) .......................... 201910801463.0

(51) Int. Cl.
C23C 14/04 (2006.01)
G06F 30/20 (2020.01)
(Continued)

(52) U.S. Cl.
CPC ............ *C23C 14/042* (2013.01); *G06F 30/20* (2020.01); *H10K 71/00* (2023.02); *H10K 71/166* (2023.02)

(58) Field of Classification Search
CPC ......... C23C 14/042; C23C 8/04; C23C 10/04; C23C 14/04; C23C 14/044; C23C 16/04;
(Continued)

(56) References Cited

U.S. PATENT DOCUMENTS 7,837,528 B2 11/2010 Shigemura et al.
2004/0104197 A1* 6/2004 Shigemura ........... H10K 71/166
216/20
(Continued)

FOREIGN PATENT DOCUMENTS

CN 1510971 A 7/2004
CN 104561892 A 4/2015
(Continued)

OTHER PUBLICATIONS

Restriction Requirement for U.S. Appl. No. 16/959,409 dated Nov. 17, 2021.
(Continued)

*Primary Examiner* — Aiden Lee
(74) *Attorney, Agent, or Firm* — The Webb Law Firm

(57) ABSTRACT

The present disclosure relates to a mask, a mask device and a mask design method. The mask includes: a pattern area, wherein the pattern area includes a plurality of openings, among which adjacent openings are spaced apart by a first rib, and at least one of the plurality of openings has a non-straight side, two first straight sides intersecting with the non-straight side, and a second straight side opposite to the non-straight side and intersecting with the first straight sides; and a second rib located at an edge of the pattern area, wherein the second rib is provided with a cutout for com-
(Continued)

pensating for stretch deformation of the non-straight side, extending lines of the two first straight sides extending toward the second rib along a first direction intersect with the second rib to obtain a first area, and the cutout is located at least within the first area.

14 Claims, 7 Drawing Sheets

(51) Int. Cl.
*H10K 71/00* (2023.01)
*H10K 71/16* (2023.01)

(58) Field of Classification Search
CPC .... C23C 16/042; C23C 18/06; H10K 71/166; C30B 25/04
See application file for complete search history.

(56) References Cited

U.S. PATENT DOCUMENTS

| | | | |
|---|---|---|---|
| 2011/0031486 A1* | 2/2011 | Shigemura | H10K 71/00 257/E51.019 |
| 2016/0263607 A1 | 9/2016 | Wang et al. | |
| 2016/0348227 A1 | 12/2016 | Wu et al. | |
| 2018/0155818 A1 | 6/2018 | Mu et al. | |
| 2018/0230585 A1 | 8/2018 | Bai | |
| 2018/0239241 A1 | 8/2018 | Lv et al. | |
| 2019/0093216 A1 | 3/2019 | Zhou et al. | |
| 2019/0203336 A1 | 7/2019 | Xu et al. | |
| 2019/0203338 A1 | 7/2019 | Kawasaki et al. | |
| 2019/0233931 A1 | 8/2019 | Zhang et al. | |
| 2019/0242012 A1* | 8/2019 | Wang | B05C 21/005 |
| 2019/0276927 A1 | 9/2019 | Wang et al. | |
| 2019/0368028 A1 | 12/2019 | Yamabuchi et al. | |
| 2021/0020871 A1 | 1/2021 | Wang et al. | |
| 2021/0108310 A1* | 4/2021 | Miyamoto | H10K 71/00 |
| 2021/0404049 A1* | 12/2021 | Xu | B05C 17/06 |

FOREIGN PATENT DOCUMENTS

| | | |
|---|---|---|
| CN | 104630705 A | 5/2015 |
| CN | 204434717 U | 7/2015 |
| CN | 105154823 A | 12/2015 |
| CN | 106019819 A | 10/2016 |
| CN | 206188876 U | 5/2017 |
| CN | 107236927 A | 10/2017 |
| CN | 107587106 A | 1/2018 |
| CN | 107740040 A | 2/2018 |
| CN | 107740065 A | 2/2018 |
| CN | 108169999 A | 6/2018 |
| CN | 207468709 U | 6/2018 |
| CN | 108251796 A | 7/2018 |
| CN | 108365134 A | 8/2018 |
| CN | 207775334 A | 8/2018 |
| CN | 108642441 A | 10/2018 |
| CN | 109321880 A | 2/2019 |
| CN | 109735802 A | 5/2019 |
| CN | 210420132 U | 4/2020 |
| JP | S6247476 A | 3/1987 |
| JP | 2008041553 A | 2/2008 |
| JP | 2017020068 A | 1/2017 |
| JP | 2017210657 A | 11/2017 |
| JP | 6519395 B2 | 5/2019 |
| KR | 1020060129899 A | 12/2006 |

OTHER PUBLICATIONS

Non-Final Office Action for U.S. Appl. No. 16/959,409 dated Mar. 21, 2022.

* cited by examiner

MASK, MASK DEVICE AND MASK DESIGN METHOD

CROSS-REFERENCE TO RELATED APPLICATIONS

The present application is a U.S. National Stage Application under 35 U.S.C. § 371 of International Patent Application No. PCT/CN2020/092531, filed on May 27, 2020, which is based on and claims priority to Chinese Patent Application No. 201910801463.0 filed on Aug. 28, 2019, the disclosure of both which are incorporated by reference herein in their entirety.

TECHNICAL FIELD

The present disclosure relates to the field of designing and manufacturing a display element, and in particular to a mask, a mask device and a mask design method.

BACKGROUND

The irregular screen refers to a display screen with an irregular or asymmetric display area, for example, the upper and lower edges of the display screen are asymmetrical. During the manufacturing process of the irregular screen, in the related art, a light-emitting material is deposited at a corresponding position of the substrate by evaporation using a support mask having a corresponding irregular opening area.

SUMMARY

In one aspect of the present disclosure, a mask is provided. The mask includes: a pattern area, wherein the pattern area includes a plurality of openings, among which adjacent openings are spaced apart by a first rib, and at least one of the plurality of openings has a non-straight side, two first straight sides intersecting with the non-straight side, and a second straight side that is located on an opposite side of the non-straight side and intersects with the first straight sides; and a second rib located at an edge of the pattern area, wherein the second rib is provided with a cutout for compensating for stretch deformation of the non-straight side, extending lines of the two first straight sides extending toward the second rib along a first direction intersect with the second rib to obtain a first area, and the cutout is located at least within the first area, where the first direction is parallel to the first straight side, and a second direction perpendicular to the first direction is parallel to the second straight side.

In some embodiments, the plurality of openings are distributed in an array, part or all of the openings in each column of openings have non-straight sides extending substantially along the second direction, where the second direction is parallel to a row direction of the array, and the cutout is provided within the first area of the second rib corresponding to each column of openings.

In some embodiments, the plurality of openings have the same shape and size, and the first straight sides of the plurality of openings are all parallel to the first direction, where the first direction is parallel to a column direction of the array, and the cutout provided within the first area of the second rib corresponding to each column of openings has the same number, shape and size.

In some embodiments, a length of the non-straight side in the second direction is less than a length of each of the first straight sides, and equal to a length of the second straight side.

In some embodiments, the non-straight side includes: two straight sections and a recess section recessed toward inner side of the opening relative to the straight sections, both ends of the recess section are respectively connected to the two straight sections, and the cutout is symmetrical relative to a centerline of the recess section, where the centerline of the recess section is parallel to the first direction.

In some embodiments, the recess section is located at a middle position of the non-straight side.

In some embodiments, the recess section is in a shape of a polyline or a circular arc.

In some embodiments, a length of the cutout located in the second rib in the second direction is less than a length of the non-straight side in the second direction, and greater than a length of the recess section in the second direction.

In some embodiments, the length of the cutout located in the second rib in the second direction is 40 mm to 60 mm, and the length of the recess section in the second direction is 3 mm to 35 mm.

In some embodiments, cutouts in the second rib corresponding to respective column of openings have at least two cutouts arranged at intervals in the first direction.

In some embodiments, a width of the second rib in the first direction is 20 mm to 70 mm, a width of each cutout in the first direction is 0.6 mm to 1 mm, and a width of the first rib in the first direction is 10 mm to 15 mm.

In some embodiments, the non-straight side includes: two straight sections and a recess section recessed toward inner side of the opening relative to the straight sections, and both ends of the recess section are respectively connected to the two straight sections, where a width of the recess section in the first direction is 0.5 mm to 8 mm.

In some embodiments, a center-to-center distance of adjacent cutouts in the first direction is 4 mm to 8 mm.

In some embodiments, a shape of the cutout is a rectangle shape or a crescent shape, and a raised direction of two circular arc edges of the crescent shape is opposite to a recessed direction of the recess section.

In some embodiments, the cutout is a through hole.

In some embodiments, an extending direction of the cutout is substantially parallel to the second direction.

In some embodiments, the cutout is also provided in the first rib connected with the non-straight side, extending lines of the two first straight sides extending toward the first rib along the first direction intersect with the first rib to obtain a second area, and the cutout is located at least within the second area.

In some embodiments, the number of the cutouts provided in each of the first ribs connected with the non-straight side is one.

In another aspect of the present disclosure, a mask device is provided. The mask device includes a frame; and the aforementioned mask, which is disposed on the frame.

In some embodiments, the mask device further includes: a fine mask disposed on the frame; wherein the mask is configured to serve as a support mask to support the fine mask.

In another aspect of the present disclosure, a mask design method is provided. The method includes the steps of: modeling at least part selected of a layout design drawing of a mask to be optimized for modeling to obtain a mask model, wherein in the layout design drawing, the mask to be optimized includes a pattern area and a second rib located at an edge of the pattern area, and the pattern area includes a plurality of openings, in which adjacent openings are spaced apart by a first rib; performing stretching simulation on the mask model, and determining an opening among the plurality of openings that satisfies a condition that a local relative offset of a side in a first direction exceeds a first preset threshold as a reference opening based on a simulation result, where the first direction is a stretching direction during stretching simulation; and providing a cutout in the second rib in the layout design drawing, wherein an extending line of a side of the reference opening extending toward the second rib along the first direction intersects with the second rib to obtain a first area, and the cutout is located at least within the first area.

In some embodiments, the design method further includes: if it is determined that the local relative offset of the side of the reference opening exceeds a second preset threshold greater than the first preset threshold based on a simulation result, also providing a cutout in the first rib in the layout design drawing, wherein an extending line of the side of the reference opening extending toward the first rib connected with the reference opening along the first direction intersects with the first rib to obtain a second area, and the cutout is located at least within the second area.

In some embodiments, modeling step includes: selecting ¼ part of the layout design drawing for modeling, wherein the ¼ part is taken from any corner point of the layout design drawing; wherein, after optimizing selected part of the layout design drawing, the design method further includes: optimizing ¾ part of the layout design drawing that has not been selected according to an optimization method for the ¼ part.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1:
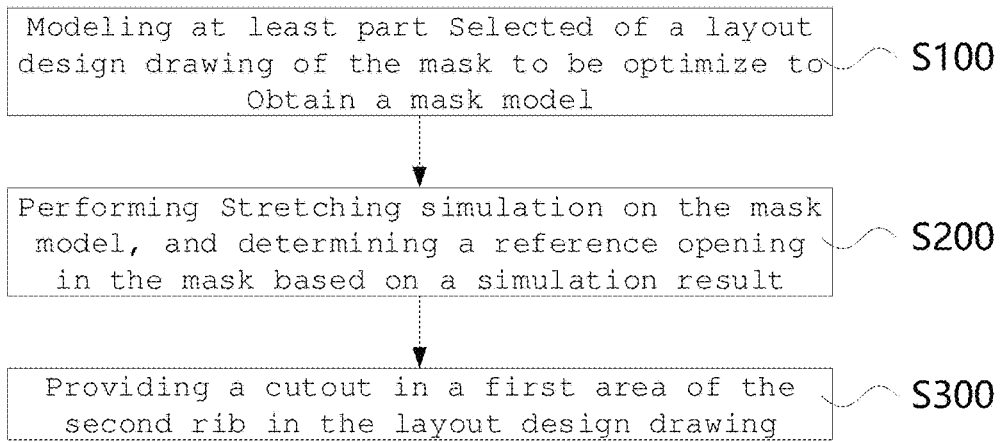
FIG. 1 is a schematic flowchart of an embodiment of a mask design method according to the present disclosure.

It should be understood that the dimensions of the various parts shown in the accompanying drawings are not drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The words "first", "second", and similar words used in the present disclosure do not denote any order, quantity or importance, but merely serve to distinguish different parts. Such similar words as "comprising" or "including" mean that the element preceding the word encompasses the elements enumerated after the word, and does not exclude the possibility of encompassing other elements as well. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (including technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

During the OLED (Organic light-emitting diode) panel production process, the mask device for vacuum evaporation is a component of vital importance. The quality of the mask device directly affects the manufacturing cost of the production and the quality of the product. In some related technologies, the mask device for evaporation may include a frame, a support mask, and a fine metal mask, wherein the support mask and the fine metal mask are sequentially welded on the frame. When the opening area of the support mask exceeds a certain offset from a design position, the organic light-emitting materials evaporated through the adjacent supporting metal mask and fine metal mask may interfere with each other in color during light emission, thereby resulting in undesirable conditions such as color mixture of the display device during display.

During the manufacturing of the irregular screen, there is a need to use a support mask with an irregular opening area, which support mask is required to be welded to the frame after stretching so as to subsequently weld the fine metal mask. Under the action of a stretching force, when the support mask as limited by an irregular shape and a low manufacturing accuracy is stretched and welded to the frame, the irregular opening area in the irregular mask is easily to be offset from a design position, so that the evaporation precision is reduced, thereby resulting in undesirable conditions such as color mixture of the manufactured display device during display, and even affecting the product yield of the entire batch.

In view of this, the embodiments of the present disclosure provide a mask, a mask device, and a mask design method, which can reduce the uneven deformation of the opening area of the mask when the mask is stretched.

Figure 2:
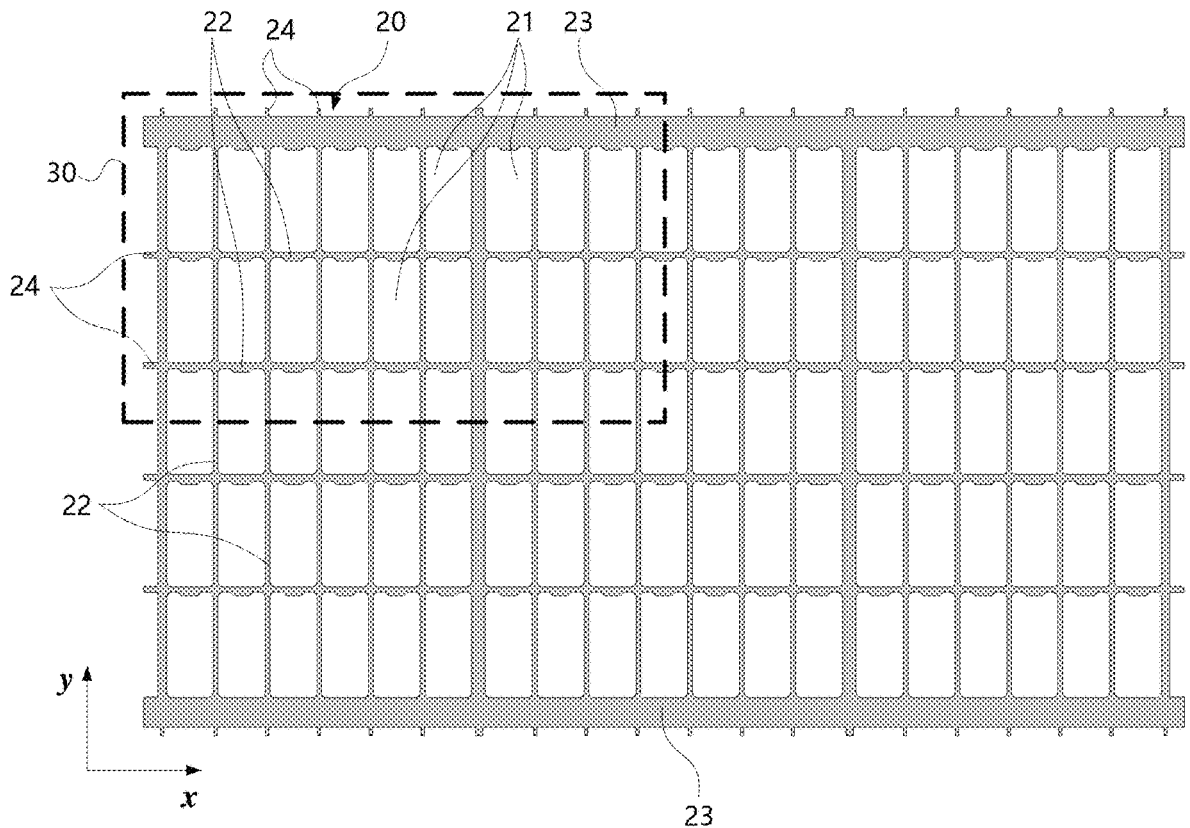
FIG. 2 is an example of a layout design drawing of a mask to be optimized used in an embodiment of a mask design method according to the present disclosure.
Figure 3:
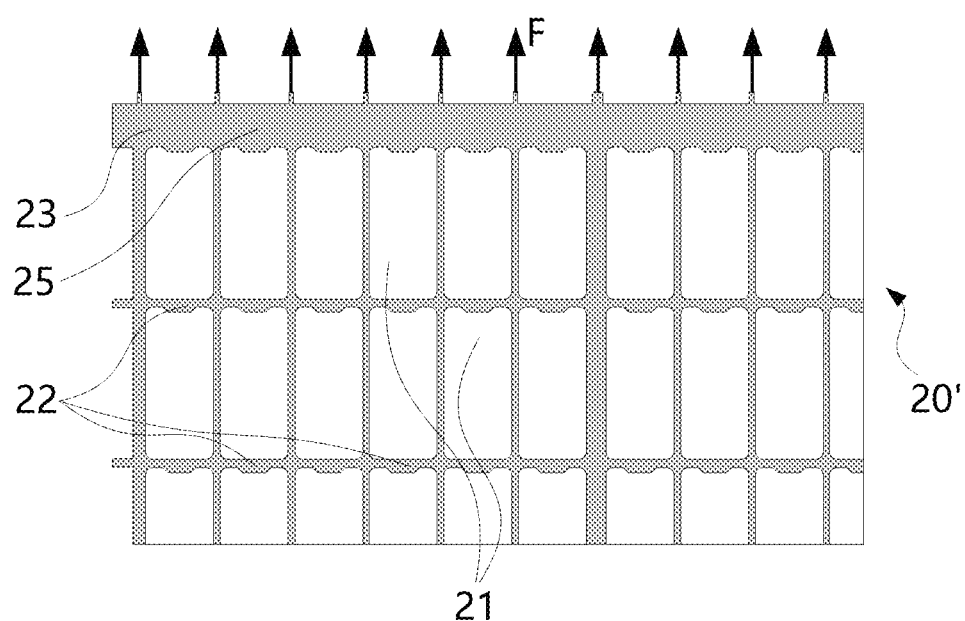
FIG. 3 is a schematic view of modeling an upper left ¼ part (within a dashed frame) and performing stretching simulation of an example of a layout design drawing of FIG. 2.
Figure 4:
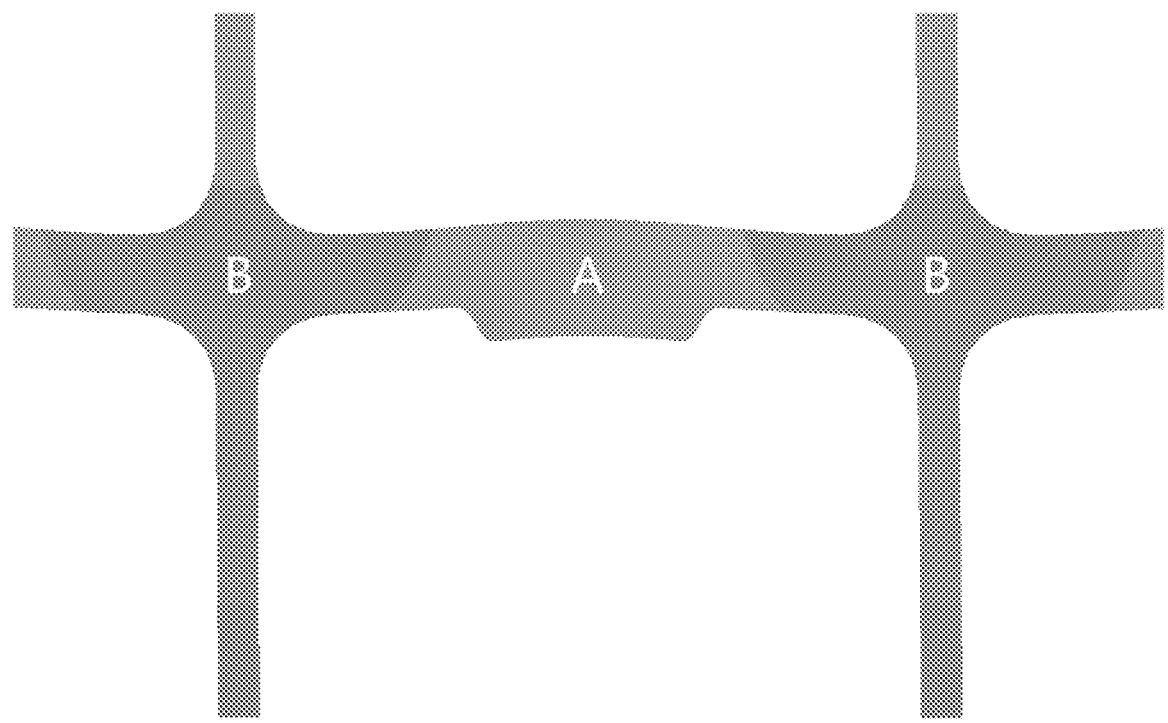
FIG. 4 is a deformation cloud chart of a first rib between two adjacent opening areas in a stretching direction after stretching simulation based on the mask model corresponding to FIG. 3.

FIG. 1 is a schematic flowchart of an embodiment of a mask design method according to the present disclosure. FIG. 2 is an example of a layout design drawing of a mask to be optimized used in an embodiment of a mask design method according to the present disclosure. FIG. 3 is a schematic view of modeling an upper left ¼ part (within a dashed frame) and performing stretching simulation of an example of a layout design drawing of FIG. 2. FIG. 4 is a deformation cloud chart of a first rib between two adjacent opening areas in a stretching direction after stretching simulation based on the mask model corresponding to FIG. 3.

Referring to FIG. 1, in some embodiments, the mask design method includes steps S100 to S300.

In step S100, at least part selected of the layout design drawing of the mask to be optimized is modeled to obtain a mask model. Referring to an example of a layout design drawing shown in FIG. 2, in the layout design drawing, the mask 20 to be optimized may include a pattern area and a second rib 23 located at an edge of the pattern area. The pattern area includes a plurality of openings 21, wherein adjacent openings 21 are spaced apart by a first rib 22.

In FIG. 2, a plurality of openings 21 may be arranged at intervals along the x-axis and the y-axis perpendicular to each other respectively, so as to form an array of openings. The size and shape of the opening 21 may be designed as required. For the support mask, the shape and size of the opening 21 may be consistent with the actual display area of the display device. For example, for a mobile terminal with a sensor element in the top area of the display screen, its opening may be designed to have an inwardly convex portion adapted to the shape of the display screen, such that the convex portion corresponds to an area where the sensor element is arranged.

When the design of the mask is optimized, the overall layout design drawing of the mask to be optimized may be modeled first to obtain the mask model. In some embodiments, in the case where the layout design drawing is relatively symmetrical, apart of the layout design drawing may be selected for modeling to obtain a mask model, thereby reducing the amount of data during model calculation and improving the efficiency.

In FIG. 2, the plurality of openings 21 have the same or substantially the same shape and size, and are distributed at equal intervals along the x-axis and the y-axis. Correspondingly, in some embodiments, during the modeling process, ¼ part of the layout design drawing (see the portion selected by the dashed frame in FIG. 2) may be selected for modeling. The ¼ part is taken from any corner point of the layout design drawing.

Although the upper and lower edges of the opening 21 are asymmetrical along the y-axis, since the asymmetrical size accounts for a very small proportion of the overall size of the opening 21, there is a relatively limited influence. In this way, the layout design drawing selected by the dashed frame may be mirrored once or twice relative to a centerline parallel to the x-axis and a centerline parallel to the y-axis so as to approximately obtain the other ¾ part of the layout design drawing.

In step 200, stretching simulation is performed on the established mask model, and a reference opening in the mask is determined based on a simulation result. The reference opening here refers to an opening that satisfies the condition that a local relative offset of the side in a first direction exceeds the first preset threshold during stretching simulation.

Referring to FIG. 3, the first direction may be defined as a stretching direction during stretching simulation, that is, the y-axis direction in FIG. 2. The stretching force F during stretching simulation may act on each pin 24 outside the edge of the mask in FIG. 2, and the direction of the stretching force F is a stretching direction, which is consistent with the y-axis direction.

Taking the opening 21 in FIG. 3 as an example, the stretching direction is the y-axis direction. In this direction, if the local relative offset of the upper or lower side of the opening 21 exceeds the first preset threshold, the opening 21 may be defined as a reference opening. The local relative offset may be a local offset of the side itself relative to other parts during stretching simulation. The first preset threshold may be set according to factors such as the material of the mask and the position of the opening area.

When stretching simulation is performed on the mask model, since the opening 21 has a non-straight side or asymmetrical upper and lower sides, there is a difference in local relative offsets of different parts of the sides. In FIG. 4, the upper side of the opening 21 has a trapezoidal recess section that is inwardly recessed. Referring to the deformation cloud map of the first rib between adjacent openings displayed in different gray scales in a stretching direction in FIG. 4, the deformation of the part A of the first rib corresponding to the trapezoidal recess section may reach $1.167\ e^{-1}$ mm to $1.333\ e^{-1}$ mm, and the deformation of the part B corresponding to a relatively flat part on both sides of the trapezoidal recess section is $1.000\ e^{-1}$ mm to $1.167\ e^{-1}$ mm, which is less than the deformation of the part A. Thus, it may be seen that the stress is relatively concentrated in a part of the first rib corresponding to the trapezoidal recess section.

Figure 5:
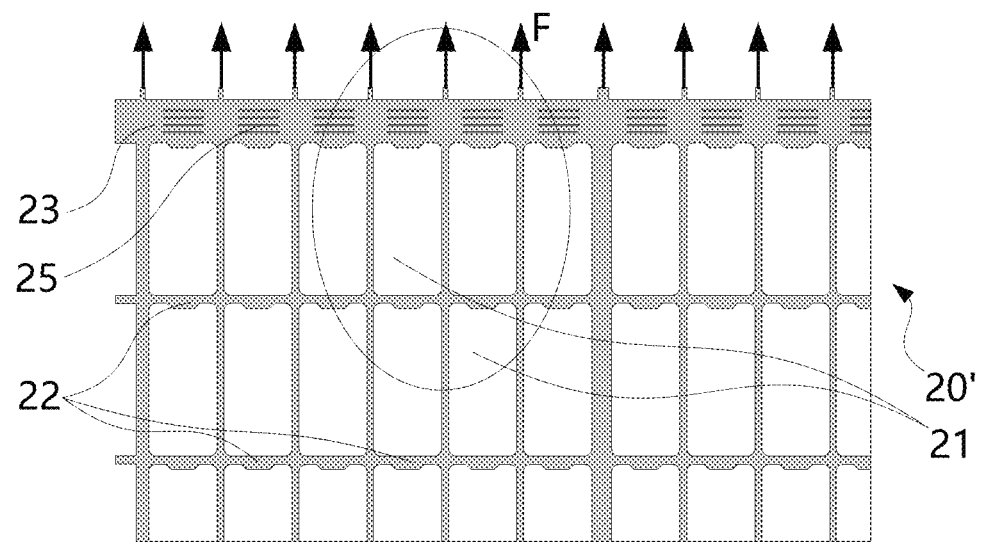
FIG. 5 is a schematic view of providing a cutout in the second rib according to an embodiment of a method for designing and optimizing a mask of the present disclosure.
Figure 6:
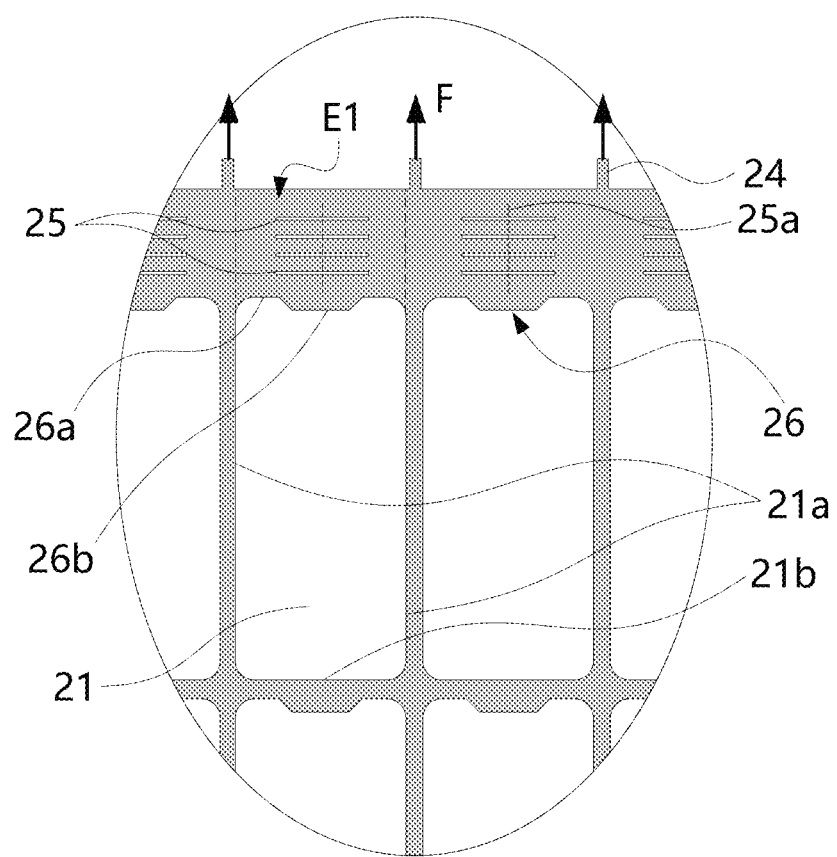
FIG. 6 is an enlarged view of the area selected by the elliptical frame in FIG. 5.
Figure 7:
FIG. 7 is a schematic view of the comparison of the deformation curves of the first rib during stretching simulation of the mask model before and after optimization.

FIG. 5 is a schematic view of providing a cutout in the second rib according to an embodiment of a method for designing and optimizing of a mask of the present disclosure. FIG. 6 is an enlarged view of the area selected by the elliptical frame in FIG. 5. FIG. 7 is a schematic view of the comparison of the deformation curves of the first rib during the stretching simulation of the mask model before and after optimization.

Referring to FIGS. 5-7, the stress concentration causes the deformation of the opening 21. In order to suppress the degree of such deformation, in step S300, a cutout 25 may be provided in the second rib 23 in the layout design drawing. The extending lines of the side of the reference opening extending towards the second rib 23 along a first direction and intersects with the second rib 23 so that a first area E1 is obtained, wherein the cutout 25 is located at least within the first area E1.

In some embodiments, the cutout may be optionally a through hole penetrating in a normal direction of the mask. The cutout may be formed by etching, and made into a through hole so that it is possible to reduce the difficulty of etching, and reduce the complexity of the process. Moreover, it is also possible to reduce a local warpage of the mask in a normal direction of the mask and reduce the risk of foreign matter produced by friction between a warped portion and the substrate to a certain extent. In other embodiments, the cutout may also be a blind hole.

Referring to FIGS. 5 and 6, a cutout 25 may be provided in the second rib 23 corresponding to the opening 21 that has been defined as a reference opening in the layout design drawing, so as to obtain a layout design drawing of a mask 20' that has been optimized.

The step of providing a cutout in the second rib 23 may include: providing a plurality of cutouts 25 in the first area E1, such that the plurality of cutouts are arranged at intervals along a first direction. Referring to FIG. 6, each reference opening area may be provided with four cutouts 25 in the first area E1 along the y-axis direction. The number and spacing of the cutouts 25 may be adjusted and optimized several times based on simulation results.

In FIG. 6, the upper side of the opening 21 is a non-straight side 26, and both sides of the non-straight side 26 respectively have two straight sections 26a. A recess section 26b that is inwardly recessed in the shape of a polyline is formed in the middle of the non-straight side 26, such that both ends of the recess section 26b are connected to the two straight sections 26a respectively. Referring to FIG. 7, the horizontal axis in FIG. 7 represents different distances from one end to the other end of the side of the opening area, and the vertical axis represents an amount of deformation (that is, an offset) compared to a state in which stretching simulation is not performed. The simulation results of the mask without a cutout 25 provided in the second rib (before optimization) and the mask provided with a cutout 25 (after optimization) are compared. It may be seen from FIG. 7 that the deformation amount curve D1 of the first rib before optimization is relatively close to the deformation amount curve D2 of the first rib after optimization, and there is an apparent difference between the deformation amounts of the recess section 26b. The deformation amount of the recess section 26b in the middle of the first rib before optimization may reach more than 0.122 mm, and the deformation amount of the recess section 26b of the optimized first rib is reduced to 0.12 mm.

In the above-described embodiment, modeling and stretching simulation are performed on the layout design drawing of the mask to be optimized to determine a reference opening with a large local offset in a stretched state and provide a cutout in the first area of the second rib corresponding to a projection of the reference opening, so that it is possible to improve a balanced stress distribution condition of the mask when actually stretched, thereby reducing the uneven deformation of the opening of the mask when the mask is stretched, and further reducing the offset degree of the opening from a design position and improving the evaporation accuracy.

For a mask in which the opening is mirror-symmetrical to itself in a second direction (for example, the x-axis direction) perpendicular to the first direction, referring to FIG. 6, in some embodiments, when a cutout is provided in the second rib, the cutout 25 may alternatively be made symmetrical relative to a centerline 25a of the recess section 26b, and the centerline 25a of the recess section is parallel to the first direction. In this way, it is possible to allow a more balanced stress distribution of the mask when stretched. In addition, in FIGS. 5 and 6, the shape of the cutout is rectangular. In other embodiments, the shape of the cutout may also be other shape, such as a crescent shape or an oval shape.

Figure 8:
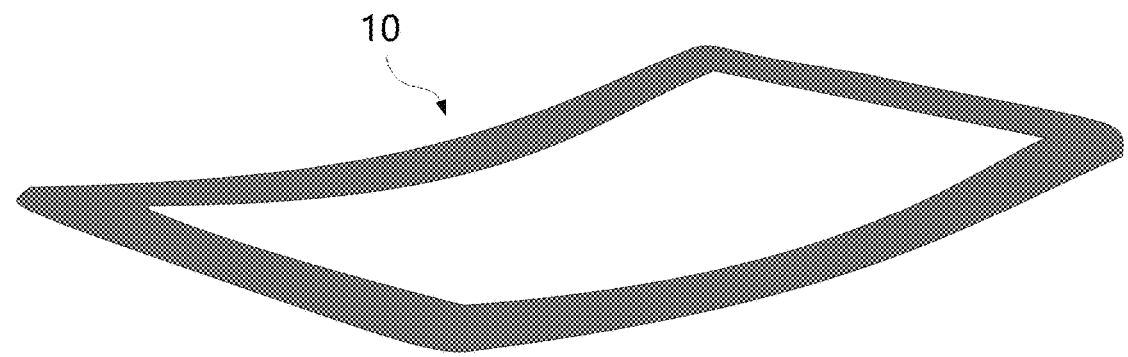
FIGS. 8 and 9 are schematic views of the warping deformation of the frame when the mask before and after the optimization is stretched and welded to the frame.
Figure 9:
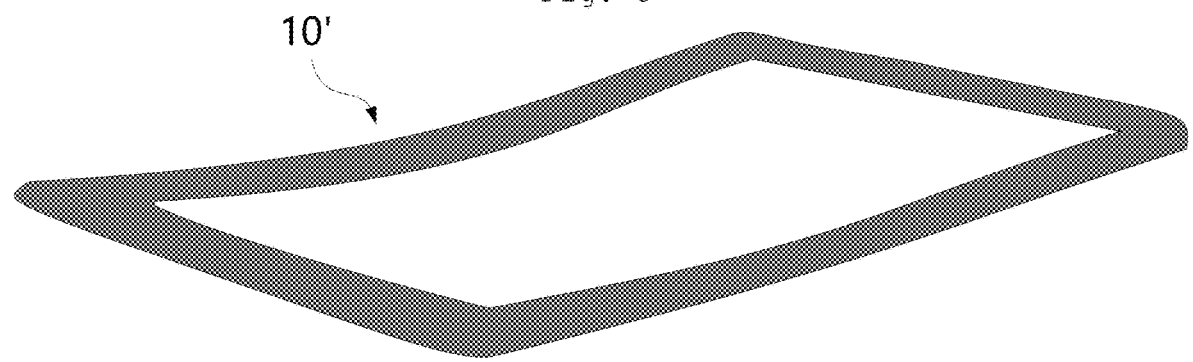

FIGS. 8 and 9 are schematic views of the warping deformation of the frame when the mask before and after the optimization is stretched and welded to the frame.

Referring to FIG. 8, for the support mask, in order to reduce the sagging degree arising from high temperature and gravity, there is a need to weld the support mask to the frame in a stretched state. After the welding is completed, a tensile force of the support mask is exerted on the frame. On one hand, the frame may resist the elastic restoration of the mask after a tensile force is released; on the other hand, the frame is deformed and warped under the tension of the support mask. It may be seen from FIG. 8 that the frame welded with the support mask before optimization may be warped significantly.

For the optimized mask, the rigidity of the second rib of the mask may be reduced by providing a cutout in the second rib, so that each part of the mask may reach a design position under the effect of a smaller tensile force, thereby reducing a tensile force that stretches the mask, so as to correspondingly reduce a tensile force of the mask on the frame, thereby lessening the warpage of the frame after the welding is completed and facilitating further improving the evaporation accuracy. It may be seen from FIG. 9 that after the optimized mask is stretched and welded to the frame, the degree of warpage of the frame is lessened as compared to FIG. 8.

Figure 10:
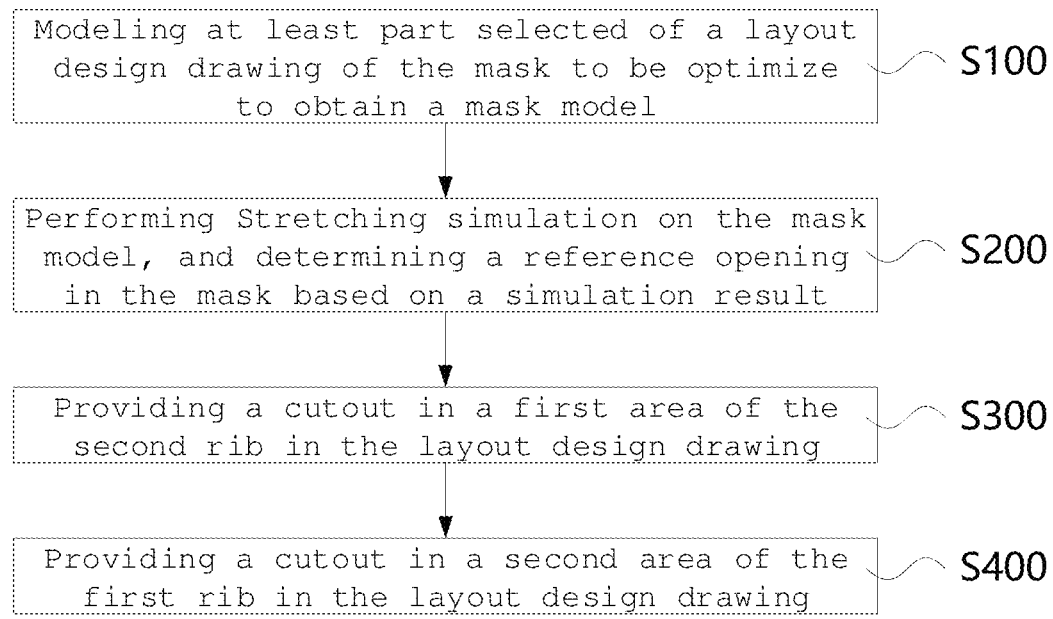
FIG. 10 is a schematic flowchart of another embodiment of a method for designing and optimizing of a mask according to the present disclosure.
Figure 11:
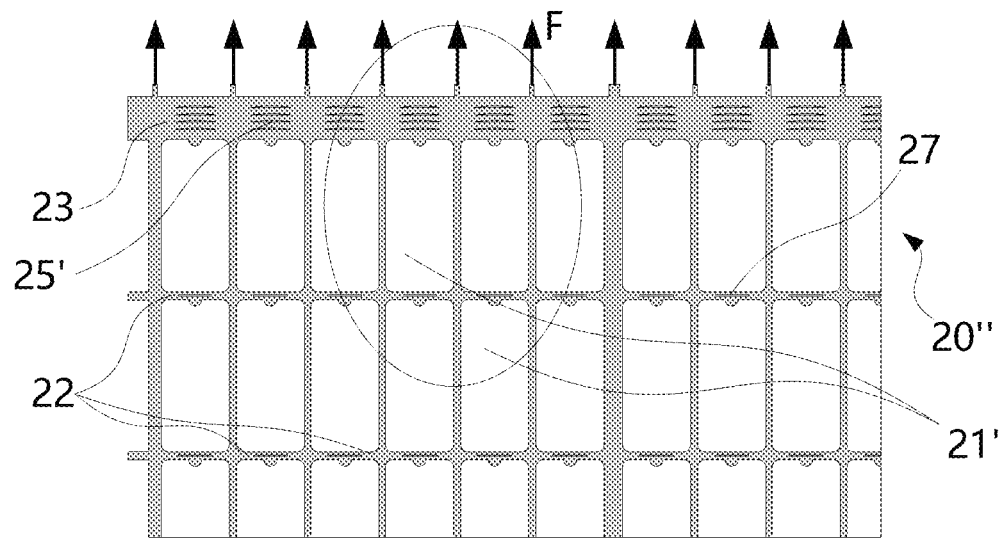
FIG. 11 is a schematic view of performing modeling and stretching simulation on part of another example of a layout design drawing of a mask.
Figure 12:
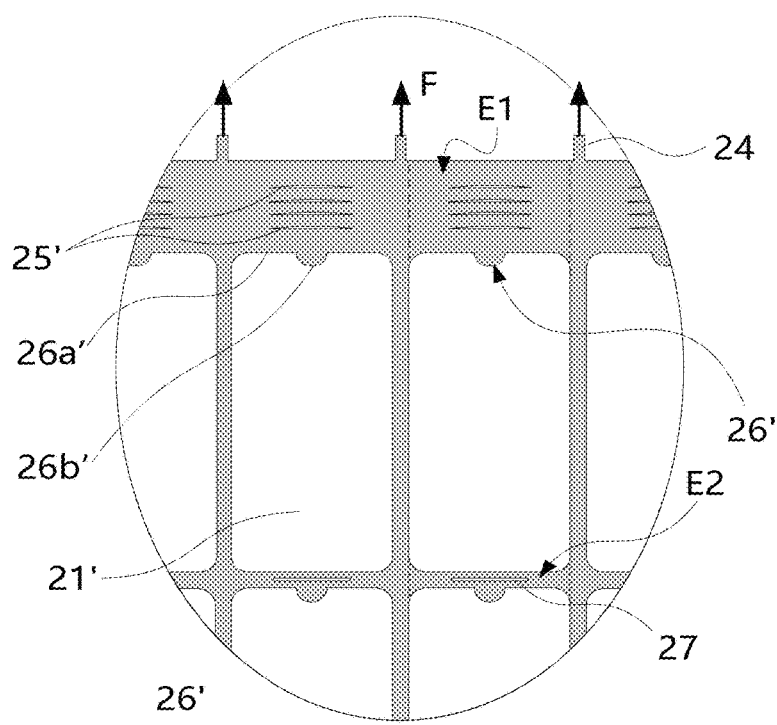
FIG. 12 is an enlarged view of the area selected by the elliptical frame in FIG. 11.

FIG. 10 is a schematic flowchart of another embodiment of a design method of a mask according to the present disclosure. FIG. 11 is a schematic view of performing modeling and stretching simulation of part of another example of a layout design drawing of a mask. FIG. 12 is an enlarged view of the area selected by the elliptical frame in FIG. 11.

Referring to FIG. 10, compared with the embodiment in FIG. 1, in some embodiments, the design method further include step S400. The step S400 may be performed before the step S300, after the step S300, or simultaneously with the step S300. In step S400, if it is determined that the local relative offset exceeds a second preset threshold based on a simulation result, and the second preset threshold is greater than the first preset threshold, a cutout 27 will also be provided in the first rib in the layout design drawing. The extending lines of the two first straight sides of the reference opening extending toward the first rib intersect with the first rib to obtain a second area E2. The cutout 27 is located at least within the second area E2. In some embodiments, the cutout may be a through hole penetrating in a normal direction of the mask. In other embodiments, the cutout may also be a blind hole.

For example, the first preset threshold of the local relative offset may be set to 0.006 mm, and the second preset threshold is 0.008 mm. When a simulation result after stretching simulation shows a local relative offset exceeding 0.006 mm, and less than or equal to 0.008 mm, the corresponding opening may be determined as a reference opening, and a cutout is provided in the corresponding second rib. If there is a local relative offset exceeding 0.008 mm, not only a cutout is provided in the corresponding second rib, but also a cutout is provided in the corresponding first rib. In some embodiments, if a simulation result of the mask shows that the local relative offsets of some openings conform to different thresholds, a cutout may be selectively provided according to the local relative offsets.

Referring to FIGS. 11 and 12, in some embodiments, the upper side of the opening 21' of the selected ¼ mask 20" is a non-straight side 26', wherein both sides of the non-straight side 26' have two straight sections 26a' respectively. A recess section 26b' that is inwardly recessed in the shape of a circular arc is formed in the middle of the non-straight side 26', and both ends of the recess section 26b' are respectively connected to the two straight sections 26a'. The recess section 26b' in the shape of a circular arc is more easily to cause stress concentration in the first rib 22 than the recess section 26b in a polyline shape in FIG. 6, thereby forming a more apparent local relative offset. In order to reduce the local relative offset, in addition to providing a cutout in the second rib 23, a cutout may also be provided in the first rib 22. The shape of the cutout may be a rectangular shape, a crescent shape or a semi-circular shape.

For a mask with a narrow first rib 22 between adjacent openings 21', it is optional that a single cutout 27 may be provided in the second area of the first rib connected with the reference opening in the layout design drawing. On one hand, the single cutout 27 may cooperate with the cutout 25' in the second rib 22 to improve a balanced stress distribution condition of the mask when actually stretched, and on the other hand, it is also possible to avoid excessively weakening the rigidity of the first rib 22, so as to avoid a significant deformation or warping when the mask is stretched.

In FIGS. 11 and 12, the second rib 23 may be provided with a cutout 25' in a crescent shape. The crescent shape refers to an enclosed shape with two circular arc edges, such that a raised direction of the two circular arc edges of the crescent shape is opposite to a recessed direction of the recess section. In other words, the distance from both ends of the crescent-shaped cutout to a straight section of the non-straight side is less than the distance from a middle part of the crescent-shaped cutout to the straight section. In other embodiments, the second rib 23 may also be provided with a cutout 25 in a rectangular shape as shown in FIG. 6.

In each embodiment of the above-described mask design method, if the mask model is modeled from part of the layout design drawing, other parts of the layout design drawing that have not been selected will be correspondingly optimized according to an optimization manner of the selected part. With reference to FIG. 2, since it is mentioned above that the selected part of the layout design drawing (that is, the ¼ part selected by the dashed frame) may be mirrored once or twice relative to a centerline parallel to the x-axis and a centerline parallel to the y-axis to approximately obtain the other parts that have not been selected, when a local layout design drawing after optimization in FIG. 5 is obtained, the optimization method may be expanded to the entire layout design drawing so as to improve the design optimization efficiency, that is, a cutout 25 is provided in the second rib along a first direction and the second rib along a direction opposite to the first direction in all the openings 21 respectively. Similarly, the cutout 27 provided in the first rib may also be expanded from the selected part to the unselected parts of the layout design.

Figure 13:
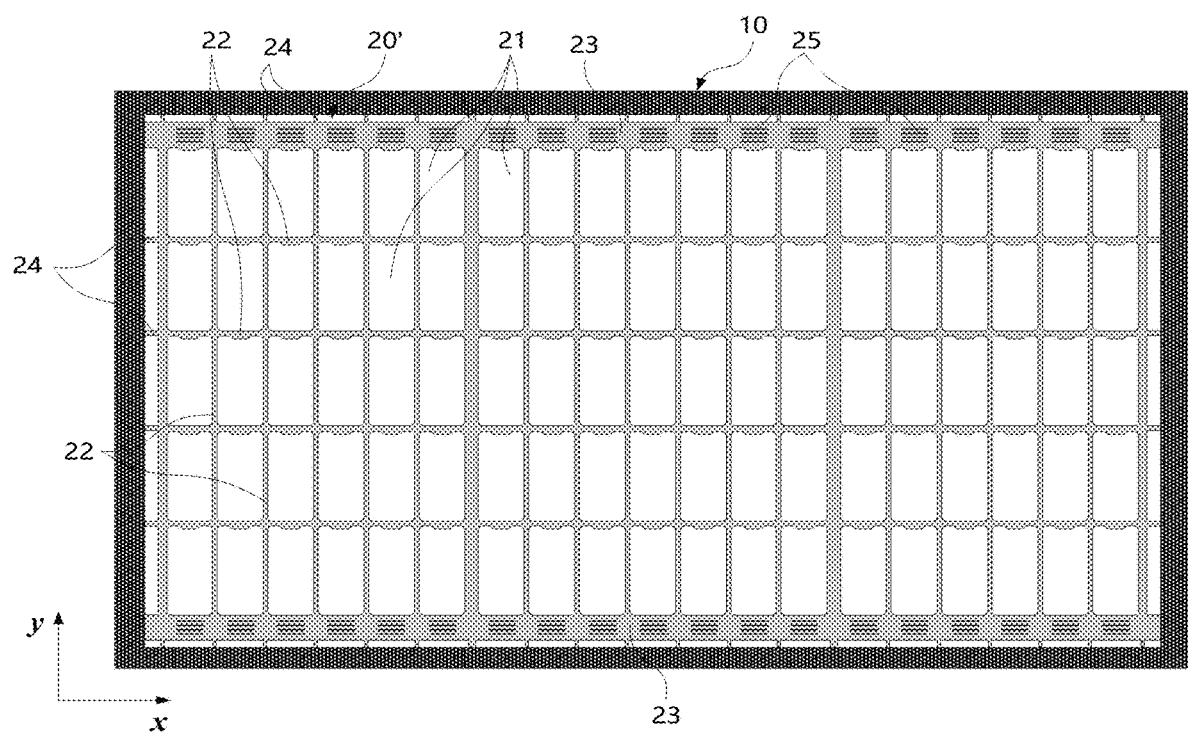
FIG. 13 is a schematic plan view of an embodiment of the mask device according to the present disclosure.

FIG. 13 is a schematic plan view of an embodiment of the mask device according to the present disclosure.

Referring to FIG. 13, in some embodiments, the mask device includes: a frame 10 and a mask 20'. The mask 20' may be manufactured using a layout design drawing of the mask obtained after optimization by the design method of the present disclosure. The mask 20' is disposed on the frame 10, for example, a plurality of pins 24 outside the edge of the mask 20' are welded to the upper surface of the frame 10 in a state when the mask 20' is stretched.

In other embodiments, the mask device may also include a fine mask. The fine mask is disposed on the frame, and the mask 20' may serve as a support mask to support the fine mask, that is, the mask is a support mask. In addition to supporting the fine mask 20', the mask 20' may also shield some areas of the fine mask, so that the evaporation material can be deposited on a corresponding display area in the substrate.

Referring to FIGS. 5, 6 and 13, in some embodiments, the mask includes: a pattern area and a second rib 23 located at an edge of the pattern area. The pattern area includes a plurality of openings 21, wherein adjacent openings 21 are spaced apart by a first rib 22. At least one of the openings 21 has a non-straight side 26, two first straight sides 21a intersecting with the non-straight side 26, and a second straight side 21b that is opposite to the non-straight side 26 and intersects with the first straight side 21a.

The second rib 23 is provided with a cutout 25 for compensating for tensile deformation of the non-straight side 26. The extending lines of the two first straight sides 21a extending towards the second rib 23 along a first direction intersect with the second rib 23 to obtain a first area E1. The cutout is located at least within the first area E1. The first direction is parallel to the first straight side 21a, and the second direction perpendicular to the first direction is parallel to the second straight side 21b. Here, the first direction may be a stretching direction during stretching simulation in the embodiments of the mask design method, that is, the y-axis direction in FIG. 13, and the second direction may be the x-axis direction in FIG. 13.

In some embodiments, it is optional that the cutout 25 may be a through hole penetrating in a normal direction of the mask. In other embodiments, the cutout 25 may also be a blind hole. The cutout 25 in the second rib 23 may improve a balanced stress distribution condition of the mask when actually stretched, thereby reducing the uneven deformation of the pattern area of the mask when the mask is stretched. In addition, the rigidity of the second rib of the mask may also be reduced, so that each part of the mask may reach a design position under the action of a smaller tensile force, so as to reduce a tensile force that stretches the mask and correspondingly reduce a tensile force of the mask on the frame, thereby further lessening the warpage of the frame after the welding is completed and facilitating improving the evaporation accuracy.

In FIG. 13, a plurality of openings 21 may be distributed in an array. All the openings 21 (in other embodiments, part of the openings 21) in each column of openings 21 have a non-straight side 26 extending substantially along a second direction. The second direction is parallel to a row direction of the array, and the cutout is provided within the first area E1 of the second rib 23 corresponding to each column of openings 21.

The plurality of openings 21 have the same shape and size, and the first straight sides 21a of the plurality of openings 21 are all parallel to the first direction, where the first direction is parallel to a column direction of the array, and the cutouts provided in the first area E1 of the second rib 23 corresponding to each column of openings 21 have the same number, shape and size. In this way, it is possible to allow a more balanced stress at each position when the mask is actually stretched, and reduce the degree of uneven deformation of the opening of the mask.

According to the shape of the display area of the display device to be manufactured, in some embodiments, the length of the non-straight side 26 in the second direction may be made less than the length of each of the first straight sides 21a, and equal to the length of the second straight side 21b.

Referring to FIG. 6, in some embodiments, the non-straight side 26 includes two straight sections 26a and a recess section 26b that is recessed toward the inner side of the opening 21 relative to the straight section 26a. Both ends of the recess section 26b are respectively connected to the two straight sections 26a, and the cutout 25 is symmetrical relative to a centerline 25a of the recess section 26b, where the centerline 25a of the recess section 26b is parallel to the first direction. By making the cutout 25 symmetrical relative to a centerline 25a of the recess section 26b, it is possible that the cutout 25 can more effectively reduce a local relative offset of the recess section 26b.

According to the shape of a display area of the display device to be manufactured, in some embodiments, the recess section 26b may be located at a middle position of the non-straight side 26, and the cutout 25 is also symmetrical relative to a centerline of the non-straight side 26 accordingly. In other embodiments, the cutout 25 may be straight, and its extending direction is substantially parallel to the second direction. For example, the shape of the cutout is rectangular, and parallel to the second direction.

In FIG. 6, the recess section 26b may be in the shape of a polyline, and in other embodiments, for example in FIG. 12, the recess section 26b' may be in the shape of a circular arc. When a cutout is provided in the second rib 23 of the mask, it is optional that the length of the cutout 25 in the second rib 23 in the second direction may be less than the length of the non-straight side 26 in the second direction, and greater than the length of the recess section 26b in the second direction. At this time, the cutout 25 does not intersect with the extending line of the tensile force F, so as to avoid apparent deformation of the cutout 25 during stretching, and the cutout 25 that is longer than the recess section 26b can more effectively improve the influence on the local relative offset of the recess section 26b. Specifically, the length of the cutout located in the second rib 23 in the second direction may be 40 mm to 60 mm, and correspondingly, the length of the recess section 26b in the second direction is 3 mm to 35 mm.

In order to more effectively improve the local relative offset of the opening and reduce the rigidity of the second rib, referring to FIG. 6, in some embodiments, the cutouts in the second rib 23 corresponding to respective column of openings 21 have at least two cutouts arranged at intervals in the first direction, for example, four cutouts 25 in FIG. 6. In some embodiments, the width of the second rib 23 in the first direction may be 20 mm to 70 mm, the width of the first rib 22 in the first direction may be 10 mm to 15 mm, and the width of the recess section 26b in the first direction is 0.5 mm to 8 mm.

Correspondingly, the width and center-to-center distance of each cutout in the first direction may be determined based on the simulation data and the position of a solid material on the fine mask. Specifically, the width of each cutout in the first direction may be set to be 0.6 mm to 1 mm, and the center-to-center distance of adjacent cutouts in the first direction may be set to be 4 mm to 8 mm.

Figure 14:
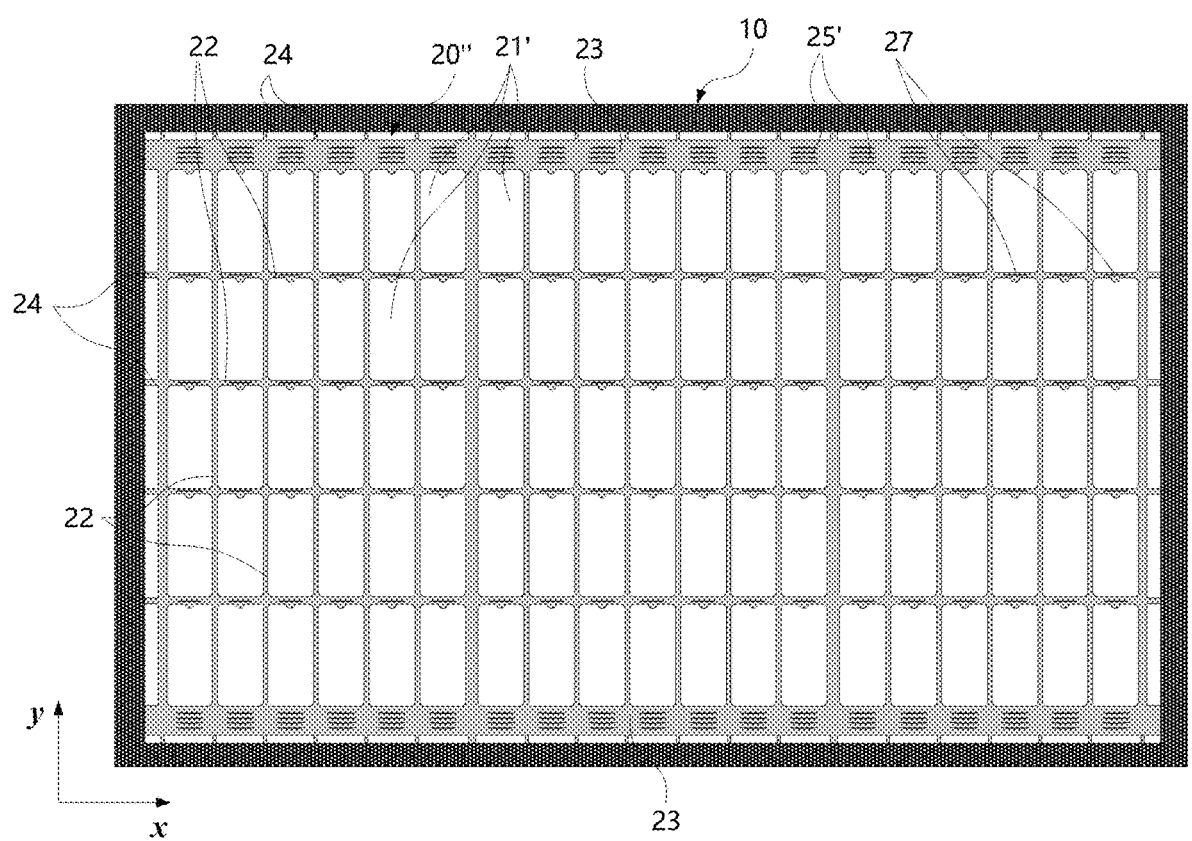
FIG. 14 is a schematic plan view of another embodiment of the mask device according to the present disclosure.

FIG. 14 is a schematic plan view of another embodiment of the mask device according to the present disclosure.

Compared with the embodiment shown in FIG. 13, in the mask 20" shown in FIG. 14, the shape of the cutout may also be a crescent shape, and a raised direction of the two arc edges of the crescent shape is opposite to a recessed direction of the recess section. In other embodiments, the plurality of cutouts 25 provided in the first area E1 of the second rib 23 may include cutouts in two or more different shapes.

In FIG. 12, the non-straight side 26' has a recess section 26b' in a circular arc shape. Since its length in the second direction is shorter than the lengths of the straight sections 26a' at both ends, its local relative offset is greater than the local relative offset of the recess section 26b in the shape of a polyline in FIG. 6. Correspondingly, referring to FIGS. 12-14, the cutout 27 may also be provided in the first rib 22 connected with the non-straight side 26. The extending lines of the two first straight sides 21a extending towards the first rib 22 along the first direction intersect with the first rib 22 to form a second area E2, wherein the cutout 27 is located at least within the second area E2. The relevant size and position of the cutout 27 may refer to the aforementioned cutout 25 located in the first area E1. With the cutout 27, it is possible to effectively improve the local relative offset of the recess section 26b'.

In order to avoid excessively weakening the rigidity of the first rib 22, it is optional that the number of the cutouts provided in each of the first ribs 22 connected with the non-straight side 2 may be one.

The above-described embodiments of the mask may be applied to a mask device, and the positions of the cutouts provided in the first and second ribs of the mask correspond to a region of a solid material of the fine mask, so as to prevent leakage of redundant evaporation material. The support mask and the fine mask may be both made of metal.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features may be made without departing from the scope and spirit of the present disclosure. The scope of the present disclosure is defined by the appended claims.

What is claimed is:

1. A mask, comprising:
 a pattern area, wherein the pattern area comprises a plurality of openings, among which adjacent openings are spaced apart by a first rib, and at least one of the plurality of openings has a non-straight side comprising two straight sections and a recess section, two first straight sides connected with the non-straight side, and a second straight side that is located on an opposite side of the non-straight side and is connected with the first straight sides; and a second rib located at an edge of the pattern area, wherein the second rib is provided with a cutout for compensating for stretch deformation of the non-straight side, extending lines of the two first straight sides extending toward the second rib along a first direction intersect with the second rib to obtain a first area, and the cutout is located at least within the first area, wherein the first direction is parallel to the first straight side, and a second direction perpendicular to the first direction is parallel to the second straight side; and wherein the recess section is recessed toward inner side of the opening relative to the straight sections, both ends of the recess section are respectively connected to the two straight sections, and a length of the cutout located in the second rib in the second direction is less than a full length of the non-straight side in the second direction, and greater than a length of only the recess section in the second direction; and a shape of the cutout is a crescent shape, and a raised direction of two circular arc edges of the crescent shape is opposite to a recessed direction of the recess section.

2. The mask according to claim 1, wherein the plurality of openings are distributed in an array, part or all of the openings in each column of the array have the non-straight sides, which are extending substantially along the second direction, wherein the second direction is parallel to a row direction of the array, and the cutout is provided within the first area of the second rib corresponding to each column of the array.

3. The mask according to claim 2, wherein the plurality of openings have the same shape and size, and the first straight sides of the plurality of openings are all parallel to the first direction, wherein the first direction is parallel to a column direction of the array, and the cutout provided within the first area of the second rib corresponding to each column of openings has the same number, shape and size.

4. The mask according to claim 2, wherein the full length of the non-straight side in the second direction is less than a length of each of the first straight sides, and equal to a length of the second straight side.

5. The mask according to claim 2, wherein the cutout provided in the second rib further comprises cutouts corresponding to each respective column of the array, and the cutouts have at least two cutouts arranged at intervals in the first direction.

6. The mask according to claim 5, wherein a width of the second rib in the first direction is 20 mm to 70 mm, a width of each cutout in the first direction is 0.6 mm to 1 mm, and a width of the first rib in the first direction is 10 mm to 15 mm.

7. The mask according to claim 6, wherein a width of the recess section in the first direction is 0.5 mm to 8 mm.

8. The mask according to claim 5, wherein a center-to-center distance of the cutouts to be adjacent in the first direction is 4 mm to 8 mm.

9. The mask according to claim 2, wherein a length direction of the cutout is substantially parallel to the second direction.

10. The mask according to claim 1, wherein the cutout is symmetrical relative to a centerline of the recess section, and the centerline of the recess section is parallel to the first direction.

11. The mask according to claim 1, wherein the length of the cutout located in the second rib in the second direction is 40 mm to 60 mm, and the length of the recess section in the second direction is 3 mm to 35 mm.

12. The mask according to claim 1, wherein the cutout is a through hole.

13. The mask according to any one of claim 1, wherein the cutout is also provided in the first rib connected with the non-straight side, extending lines of the two first straight sides extending toward the first rib along the first direction intersect with the first rib to obtain a second area, and the cutout is located at least within the second area.

14. A mask device, comprising:
a frame; and
the mask according to claim 1, which is disposed on the frame.

* * * * *

UNITED STATES PATENT AND TRADEMARK OFFICE
CERTIFICATE OF CORRECTION

| | | |
|---|---|---|
| PATENT NO. | : 12,234,540 B2 | Page 1 of 1 |
| APPLICATION NO. | : 17/255580 | |
| DATED | : February 25, 2025 | |
| INVENTOR(S) | : Tong Niu et al. | |

It is certified that error appears in the above-identified patent and that said Letters Patent is hereby corrected as shown below:

In the Claims

Column 14, Line 33, Claim 13, delete "The mask according to any one of claim" and insert -- The mask according to claim --

Signed and Sealed this
Fifteenth Day of April, 2025

Coke Morgan Stewart
*Acting Director of the United States Patent and Trademark Office*